(12) United States Patent
Logie

(10) Patent No.: US 7,067,883 B2
(45) Date of Patent: Jun. 27, 2006

(54) LATERAL HIGH-VOLTAGE JUNCTION DEVICE

(75) Inventor: Stewart Logie, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/699,321

(22) Filed: Oct. 31, 2003

(65) Prior Publication Data

US 2005/0093069 A1    May 5, 2005

(51) Int. Cl.
*H01L 23/62* (2006.01)
*H01L 29/76* (2006.01)
*H01L 29/94* (2006.01)
*H01L 31/062* (2006.01)
*H01L 31/113* (2006.01)

(52) U.S. Cl. .................. 257/355; 257/372; 257/494; 257/546; 257/21.355; 257/21.356; 257/21.357; 257/29.355

(58) Field of Classification Search ........ 257/355–360, 257/546, 372, 373, 494, 343, 21.335–7
See application file for complete search history.

(56) References Cited

U.S. PATENT DOCUMENTS

| | | | | |
|---|---|---|---|---|
| 5,270,565 A * | 12/1993 | Lee et al. | ............ | 257/358 |
| 5,276,346 A * | 1/1994 | Iwai et al. | ............ | 257/360 |
| 5,801,431 A * | 9/1998 | Ranjan | ............ | 257/659 |
| 5,959,332 A * | 9/1999 | Ravanelli et al. | ............ | 257/360 |
| 6,066,863 A * | 5/2000 | Fujishima | ............ | 257/133 |
| 6,081,002 A * | 6/2000 | Amerasekera et al. | ...... | 257/173 |
| 6,515,331 B1 | 2/2003 | Carneiro et al. | | |
| 6,552,399 B1* | 4/2003 | Jun et al. | ............ | 257/357 |
| 6,717,219 B1* | 4/2004 | Vashchenko et al. | ....... | 257/355 |
| 6,720,622 B1* | 4/2004 | Yu | ............ | 257/355 |
| 6,750,515 B1* | 6/2004 | Ker et al. | ............ | 257/357 |
| 6,765,771 B1* | 7/2004 | Ker et al. | ............ | 361/56 |
| 6,806,160 B1* | 10/2004 | Ker et al. | ............ | 438/371 |
| 2003/0067040 A1* | 4/2003 | Chen et al. | ............ | 257/360 |
| 2003/0173630 A1* | 9/2003 | Lin et al. | ............ | 257/406 |
| 2003/0201498 A1* | 10/2003 | Hu et al. | ............ | 257/355 |
| 2003/0213971 A1* | 11/2003 | Yu | ............ | 257/119 |
| 2003/0222273 A1* | 12/2003 | Kunz et al. | ............ | 257/119 |
| 2005/0035410 A1* | 2/2005 | Yeo et al. | ............ | 257/355 |

* cited by examiner

*Primary Examiner*—Jerome Jackson
*Assistant Examiner*—Jesse A. Fenty

(57) ABSTRACT

A lateral high-voltage junction device for over-voltage protection of an MOS circuit includes a substrate having a first junction region separated from a second junction region by a substrate region. An MOS gate electrode overlies the substrate region and is separated therefrom by a gate dielectric layer. Sidewall spacers reside adjacent to opposing sides of the MOS gate electrode and overlie the substrate region. The substrate region is defined by a junction-free semiconductor region between the first and second junction regions. An input protection circuit employs the lateral high-voltage junction device to transfer voltage transients to a ground node.

5 Claims, 5 Drawing Sheets

LATERAL HIGH-VOLTAGE JUNCTION DEVICE

TECHNICAL FIELD

The present invention relates, generally, to semiconductor devices and, more particularly, to MOS transistors designed to handle high voltages in band-gap reference circuits, voltage clamps, and electrostatic discharge (ESD) protection circuits.

BACKGROUND

Circuits designed with MOS transistors often have need for high-voltage handling devices. The high-voltage devices are used in various components of the circuit, such as band-gap reference circuits, voltage clamps, and ESD protection circuits. In order to keep fabrication costs low and maintain compact circuit design, high-voltage handling devices are typically fabricated with the same processing steps as those employed to fabricate the functional components of the MOS circuit. This means that rather than employing specific fabrication steps to form devices dedicated to the particular demands of the high-voltage handling device, the inherent parasitic devices within an MOS transistor are exploited to perform the high-voltage handling function. This is, in part, a result of the difficulty of fabricating traditional bipolar transistors in modern MOS circuit technology. For example, the retrograde well structure used in advanced MOS circuits limits the current gain of vertical bipolar transistors that share the retrograde well with the MOS transistors. Further, lateral bipolar transistors cannot be used where associated MOS gate capacitors would be damaged by the high-voltages supported by the lateral bipolar transistors.

In many MOS circuits, multiple high-voltage handling devices are necessary to protect the MOS circuit against damage from an ESD event. Devices for protecting MOS circuits against ESD events include resistors, serially or parallel connected diodes, silicon controlled rectifiers, and MOS transistors acting as lateral bipolar devices. A representative conventional MOS device for use in an ESD protection circuit is illustrated in FIG. 1. The MOS device includes a source region 10 and a drain region 12 formed within a semiconductor substrate 14. A gate electrode 16 overlies the surface of semiconductor substrate 14 and is separated therefrom by a gate oxide layer 18. Sidewall spacers 20 reside adjacent to the vertical edges of gate electrode 16 and also overlie gate oxide layer 18. Sidewall spacers 20 are separated from gate electrode 16 by an oxide layer 22. A channel region 24 resides in substrate 14 between source region 10 and drain region 12. Channel region 24 also includes lightly-doped drain (LDD) regions 26 and pocket regions 28.

The MOS transistor illustrated in FIG. 1 is typical of a state-of-the-art MOS transistor found in high performance MOS circuits. Such transistors typically have gate lengths on the order of a few tenths of microns and are intended for high-speed operation. MOS devices, such as the MOS illustrated in FIG. 1, are designed to avoid voltage breakdown under normal operating conditions. During an ESD event, however, the MOS transistor illustrated in FIG. 1 will conduct significant current by means of a parasitic lateral bipolar mechanism.

The parasitic action of MOS transistor 30 is illustrated in the equivalent circuit diagram of FIG. 2. The bipolar current conduction is shown from drain region 10 (drain/collector) to source region 12 (source/emitter). Gate electrode 16 is capacitively coupled to substrate 14 (substrate/base) and to drain region 10 and source region 12 by capacitances C1, C2, and C3. The capacitances C1, C2, and C3 are a parasitic and arise through the p-n junctions created in the substrate by source and drain regions 10 and 12, LDD regions 26, and pocket regions 28. These parasitic capacitances degrade the circuit speed and reduce the breakdown voltage of the transistor.

The transistor illustrated in FIG. 1 is a poor bipolar transistor in part because it is designed for optimum performance as a high-speed MOS transistor. Accordingly, this MOS transistor has LDD and pocket regions in the channel and a very short channel length. The MOS transistor also has good gate-drain overlap, and a very thin gate oxide layer. These features combine to produce an MOS transistor having high-transconductance. At the same time, the very features that provide improved MOS transistor performance reduce the MOS transistor's ability to function as a parasitic bipolar transistor. In an attempt to overcome some of the performance problems associated with the transistor shown in FIG. 1, transistors have been designed that remove the LDD region on the drain side of the channel. Although eliminating the LDD region on one side of the channel reduces some of the parasitic capacitance, the MOS transistor still does not exhibit optimal performance as a bipolar high-voltage handling device. Accordingly, the need existed for a lateral high-voltage junction device that can be fabricated without resort to specialized fabrication steps and that can optimally function as a lateral bipolar transistor for handling high voltage transients.

SUMMARY

In accordance with the invention, a lateral high-voltage junction device for over voltage protection of a MOS circuit includes a substrate having a first junction region that is separated from a section second junction region by a substrate region. An MOS gate electrode overlies the substrate region and is separated from the substrate region by a gate oxide layer. Dielectric sidewall spacers reside adjacent to opposing sides of the MOS gate electrode and also overly the substrate region. The substrate region is defined by a uniformly-doped region of the substrate between the first junction region and the second junction region.

In another embodiment, the invention includes an input protection circuit having a lateral high-voltage that includes a voltage supply node and a ground node. An MOS circuit is coupled to the voltage supply node and to the ground node. A transistor having a first junction region is coupled to the voltage supply node and a second junction region is coupled to the ground node. The transistor also includes a substrate region between the first and second junction regions. An MOS gate electrode overlies the substrate region and is separated from the substrate region by a gate oxide layer. Dielectric sidewall spacers reside adjacent to opposing sides of the MOS gate electrode and also overly the substrate region. The substrate region is a junction-free semiconductor region extending between the first and second junction regions.

In yet another embodiment of the invention, a parallel bipolar transistor for use as a high-voltage handling device in an integrated circuit includes a substrate having a first conductivity type. A source region and a drain region of a second conductivity type reside in the substrate and are separated by a channel region. A gate electrode overlies the channel region and is separated from the channel region by a gate dielectric layer. The channel region extends from the source region to the drain region and a junction between the source region and the channel region functions as an emitter. Also, a junction between the drain region and the channel region functions as a collector. An absence of LDD extension regions in the channel region provides relatively low parasitic MOS capacitance between the channel region and the gate electrode.

DETAILED DESCRIPTION

The present invention provides a lateral high-voltage junction device that can be readily integrated into a fabrication process for a semiconductor device employing MOS technology. In accordance with the invention, the lateral high-voltage junction device can be a parallel bipolar transistor or a junction diode, or the like. The lateral high-voltage junction device is capable of shunting voltages above about 2.5 volts by reducing base width through minimization of p-n junctions in the channel region of the device, and by reducing the gate overlap of the source and channel regions. In one embodiment of the invention, the high-voltage junction device forms a component of an input protection circuit that prevents damage to an associated circuit by high-voltage transients arising from ESD events, and the like.

Figure 3:
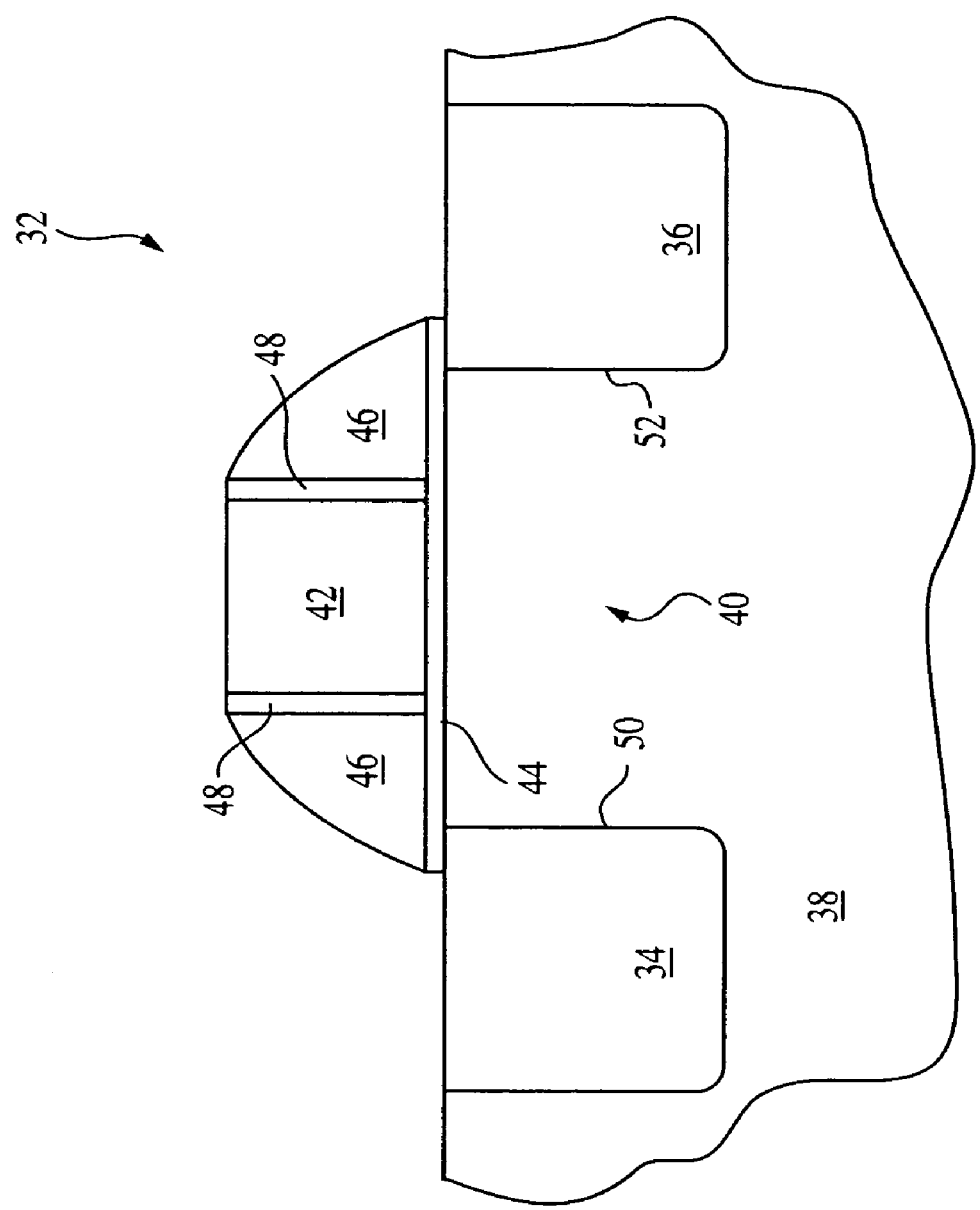
FIG. 3 illustrates, in cross-section, a parallel bipolar transistor arranged in accordance with the invention.

A parallel bipolar transistor 32 arranged in accordance with one embodiment of the invention is illustrated in FIG. 3. Parallel bipolar transistor 32 includes a source region 34 and a drain region 36 residing in a semiconductor substrate 38. A channel region 40 separates source region 34 from drain region 36. A gate electrode 42 is positioned over channel region 40 and separated therefrom by a gate dielectric layer 44. Sidewall spacers 46 reside adjacent to gate electrode 42 and also overlie gate dielectric layer 44 and channel region 40. A dielectric encapsulant layer 48 separates sidewall spacers 46 from gate electrode 42.

In accordance with the invention, semiconductor substrate 38 can be one of a number of different semiconductor materials, such as single crystal silicon, amorphous silicon, epitaxial silicon, germanium, gallium arsenide, and the like. Further, gate electrode 42 can be doped polycrystalline silicon or a refractory metal silicide, or the like. Gate dielectric layer 44 can be silicon dioxide, or a silicon oxide-silicon nitride composite material, or the like. Source region 34 and drain region 36 are preferably formed by ion implantation of a conductivity determining dopant. In the case of an n-channel device, source region 34 and drain region 36 are formed by implantation of arsenic or phosphorous, or the like. Where parallel bipolar transistor 32 is a p-channel device, the source and drain regions are formed by implantation of a p-type dopant, such as boron. Sidewall spacers 46 are preferably formed by chemical-vapor deposition (CVD) of silicon dioxide, followed by anisotropic etching.

In the illustrated embodiment, substrate 38 is a p-type substrate and source region 34 and drain region 36 are n-type regions. Accordingly, a first p-n junction 50 is formed at the interface of source region 36 and channel region 40. Correspondingly, a second p-n junction 52 is formed at the interface of channel region 40 and drain region 36. In the exemplary embodiment illustrated in FIG. 3, parallel bipolar transistor 32 is an n-type MOS transistor. Those skilled in the art will appreciate, however, that the conductivities of the source and drain region and substrate can be reversed and that parallel bipolar transistor 32 could also be a p-channel transistor. In accordance with the invention, gate dielectric layer 44 has essentially the same thickness as other gate oxide layers in an MOS circuit to which parallel bipolar transistor 32 is electrically coupled.

Figure 2:
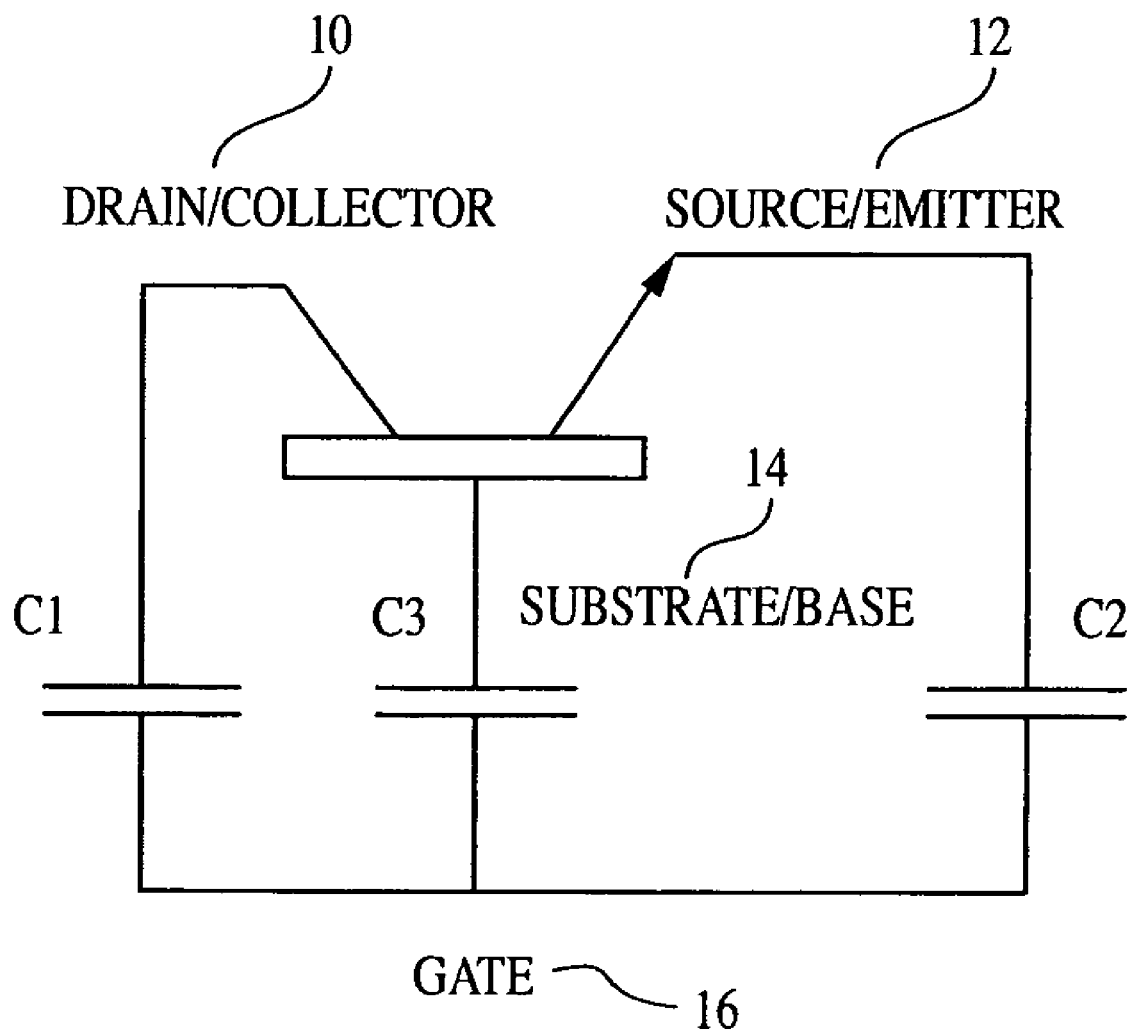
FIG. 2 is a schematic circuit representation of the transistor illustrated in FIG. 1.

In operation, parallel bipolar transistor 32 functions as a lateral bipolar transistor and is coupled to high-voltage node. The voltage is supported across source region 34 and drain legion 36 without overstressing gate oxide layer 44. Improved performance is realized in parallel bipolar transistor 32 by placing gate electrode 42 and sidewall spacers 46 directly over channel region 40 and avoiding the use of LDD regions, and pocket regions, and the like, that are typically used to improve MOS transistor performance. In comparison with the prior art transistor 30, parallel bipolar transistor 32 has an abrupt p-n junction on both sides of the channel region by creating only two p-n junctions in channel region 40. Parallel bipolar transistor 32 has a shorter base width and thus a reduced snap-back voltage, which affords better protection for an integrated circuit for voltage transients than does prior art MOS transistor 30. Further, the gate to drain overlap capacitance, denoted as C1 and C2 in FIG. 2, is minimized. This reduces the parasitic capacitance that retards the performance of circuitry attached to the transistor. Further, by eliminating all LDD and pocket regions in channel region 40, the longevity of gate dielectric 44 is greatly enhanced.

Figure 1:
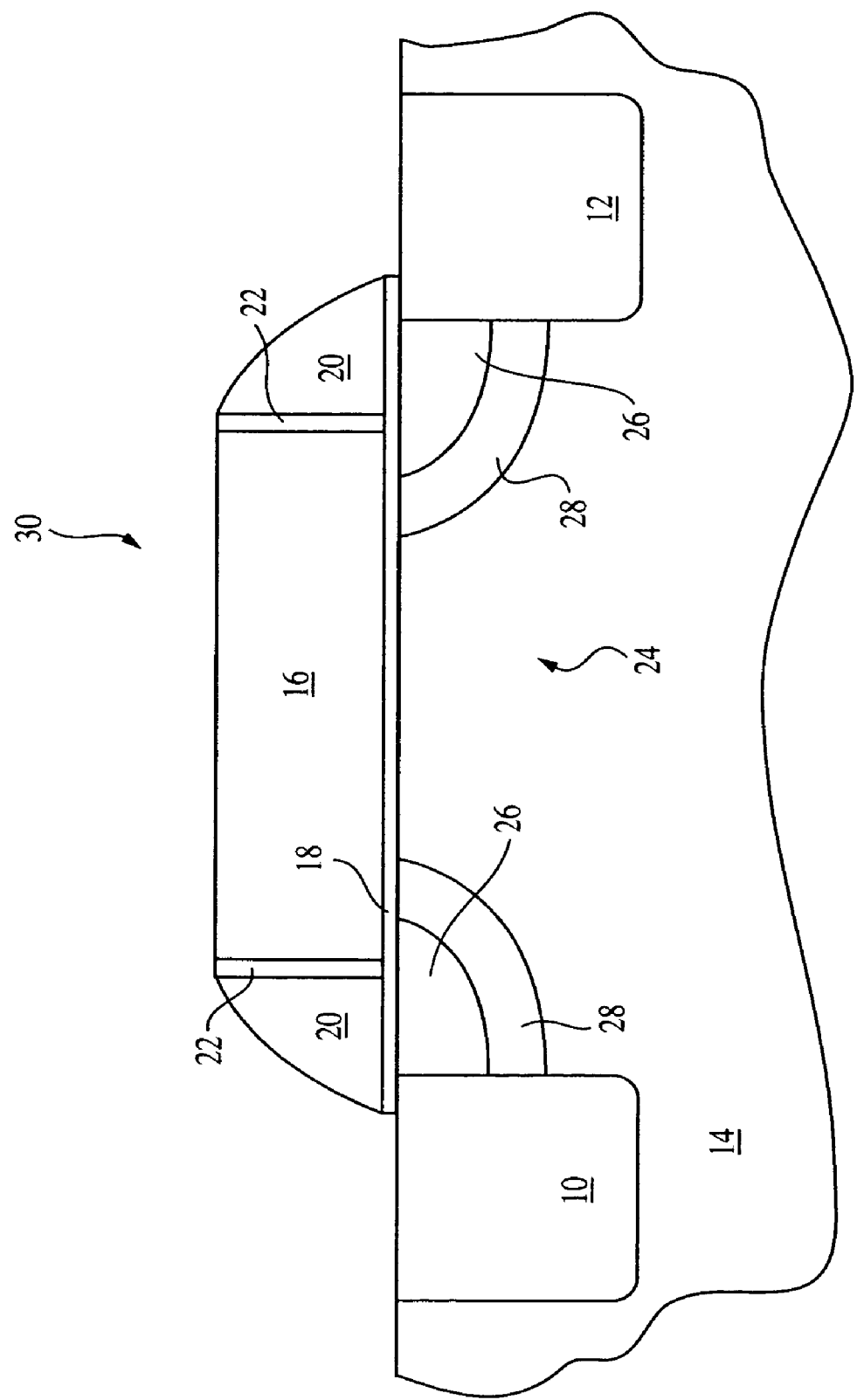
FIG. 1 illustrates an MOS transistor arranged in accordance with the prior art.

In accordance with the invention, the operating speed of parallel bipolar transistor 32 is enhanced by fabricating channel region 40 to have a channel length of about 200 nanometers or less. In comparison with the prior art transistor shown in FIG. 1, the length of channel region 40 corresponds to the lateral distance between pocket regions 28 in channel region 24. Accordingly, where the lateral high-voltage junction device of the invention is an MOS transistor, high-speed operations are maintained by the fabrication of a channel length that is no greater than the effective channel length of high-performance MOS transistors incorporated in an associated MOS circuit. The gate to substrate capacitance, denoted as C3 in FIG. 2, is also reduced in parallel bipolar transistor 32 in view of the small lateral dimension of gate electrode 42. By fabricating a gate electrode having a reduced lateral distance, the area of the parasitic gate-substrate capacitor is reduced. Further performance enhancement can be realized by electrically coupling gate electrode 42 to semiconductor substrate 38. By electrically coupling gate electrode 42 to semiconductor substrate 38, electrical stress across gate dielectric layer 44 is minimized.

Figure 4:
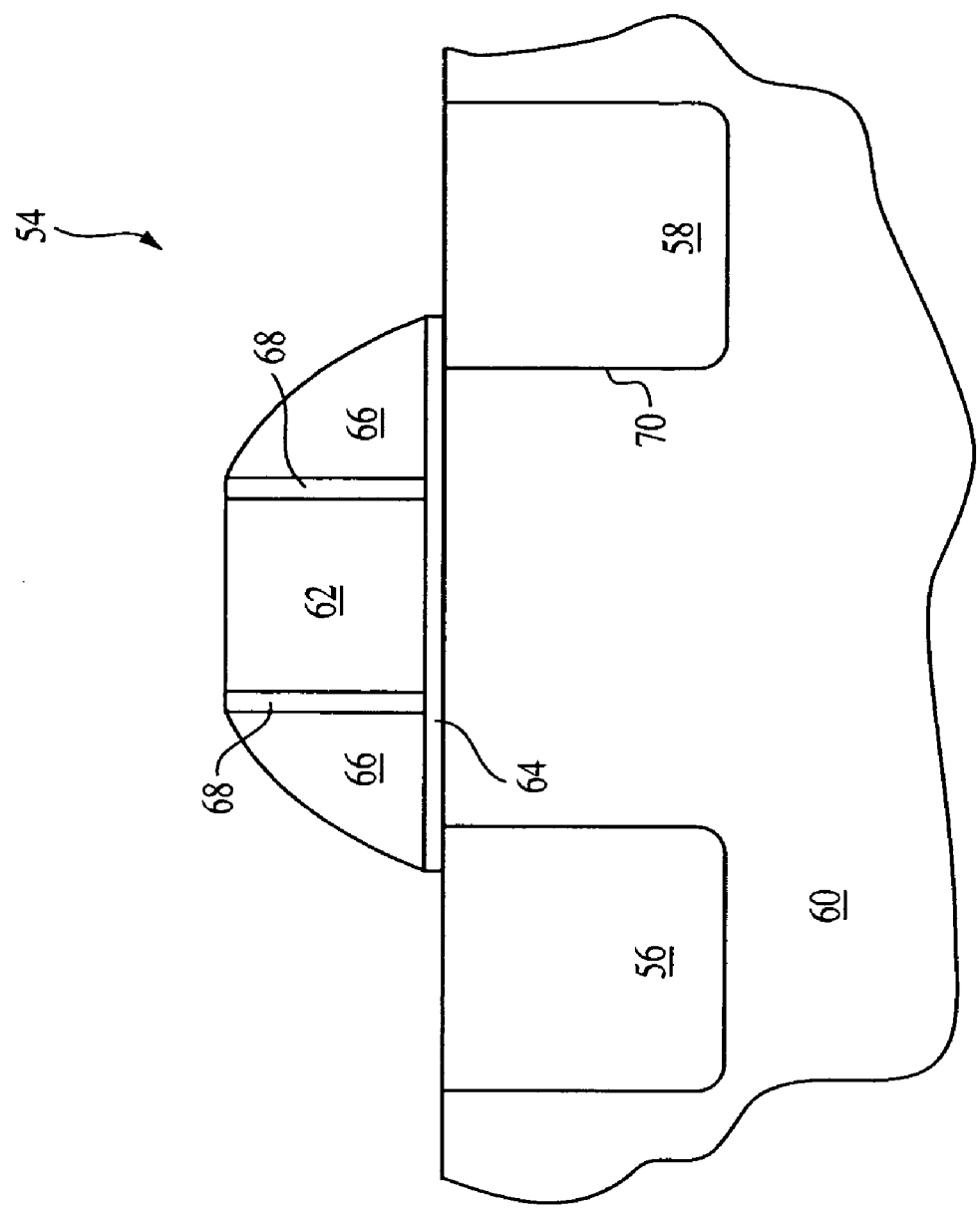
FIG. 4 illustrates, in cross-section, a junction diode arranged in accordance with the invention.

In accordance with another embodiment of the invention, a junction diode is provided that functions as a lateral high-voltage device. A junction diode 54 arranged in accordance with the invention is illustrated in FIG. 4. Junction diode 54 includes an anode 56 and a cathode 58 residing in a semiconductor substrate 60. Junction diode 54 also has a gate electrode 62 overlying semiconductor substrate 60 between anode 56 and cathode 58. A gate dielectric layer 64 separates gate electrode 62 from semiconductor substrate 60. Sidewall spacers 66 reside on either side of gate electrode 62 and also overly gate dielectric layer 64. Sidewall spacers 66 are separated from gate electrode 62 by a dielectric encapsulant layer 68.

In the embodiment illustrated in FIG. 4, semiconductor substrate 60 is a p-type substrate. Also, anode 56 is a p-type region, while cathode 58 is an n-type region. In accordance with the invention, parasitic capacitance within junction diode 54 is minimized by arranging anode 56 and cathode 58 to have a very small separation distance in semiconductor 60. In similarity to parallel bipolar transistor 32, in junction diode 54, anode 56 and cathode 58 are separated by no more than about 200 nanometers. In a preferred embodiment, gate electrode 62 has a lateral distance of about 60 nanometers, and sidewall spacers 66 each have a lateral distance of about 80 nanometers.

In similarity with parallel bipolar transistor 32, the absence of p-n junctions within the substrate region separating anode 56 from cathode 58 improves the voltage handling capability of junction diode 54. In the illustrated embodiment, only one p-n junction 70 resides in semiconductor substrate 60.

Those skilled in the art will appreciate that the conductivities of the anode, cathode, and substrate can be reversed, such that a p-n junction would be formed at the interface of anode 56 and semiconductor substrate 60. The fabrication materials of the various components of junction diode 54 are similar to those described above with respect to parallel bipolar transistor 32.

Figure 5:
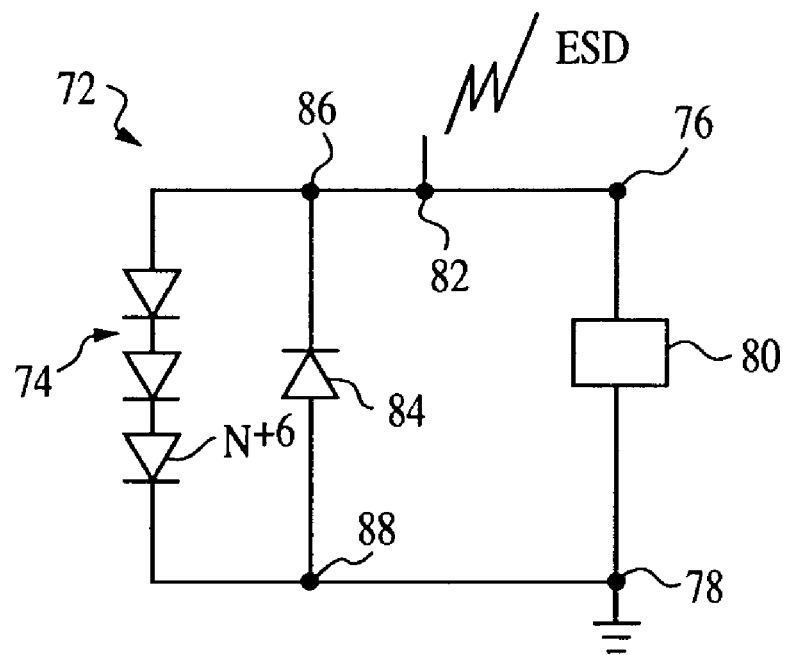
FIG. 5 illustrates a schematic diagram of an ESD protection circuit incorporating stacked diodes arranged in accordance with one embodiment of the invention.

In accordance with the invention, junction diode 54 can be configured such that several such forward-biased junction diodes are connected in series. FIG. 5 illustrates a schematic circuit diagram of an input protection circuit 72 that includes a plurality of forward biased junction diodes 74. Junction diodes 74 are coupled across a signal node 76 and a ground node 78. An MOS circuit 80 is also coupled to signal node 76 and to ground node 78. Junction diodes 74 are positioned in input protection circuit 72 to transfer a high-voltage transient, such as an ESD event occurring at an input node 82, to ground node 78. A compensating diode 84 is coupled between nodes 86 and 88 to balance input protection circuit 72.

To dissipate voltage transients, junction diodes 74 are connected, such that the anode of the first diode is coupled to input node 82 and the cathode of the N$^{th}$ diode is coupled to ground node 78. Those skilled in the art will appreciate that the input protection circuit schematically illustrated in FIG. 5 represents only one possible arrangement of junction diodes offering input protection to MOS circuit 80. For example, more than one series of forward-biased, stacked diodes can be connected between signal node 76 and ground node 78.

Figure 6:
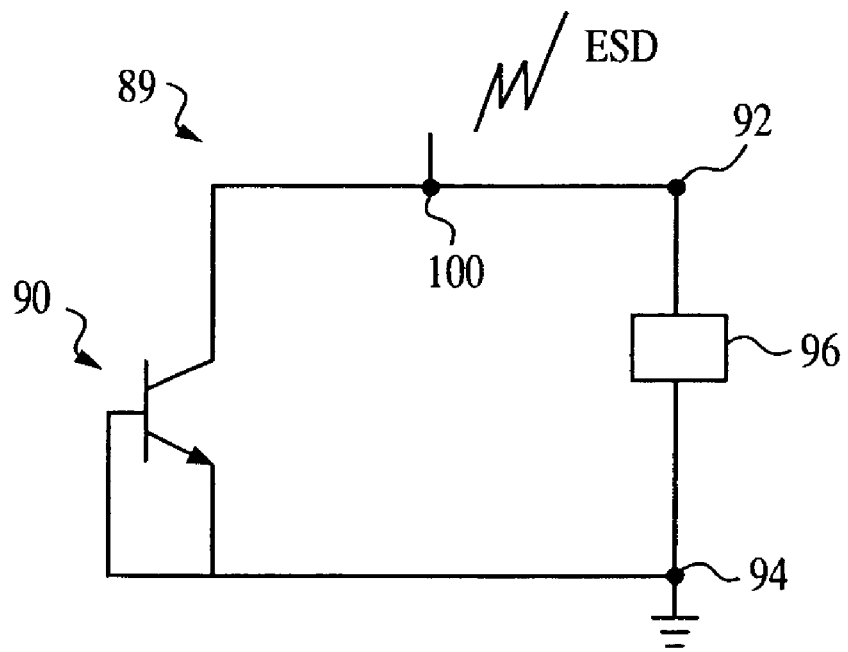
FIG. 6 illustrates a schematic diagram of an input protection circuit arranged in accordance with another embodiment of the invention.

An input protection circuit 89 having a lateral high-voltage device in accordance with another embodiment of the invention is schematically illustrated in FIG. 6. A parallel bipolar transistor 90 is coupled to a signal node 92 and to a ground node 94. An MOS circuit 96 is also coupled to signal node 92 and to ground node 94. Parallel bipolar transistor 90 is positioned in input protection circuit 89, such that voltage transients occurring at node 100 are transferred to ground node 94. Referring back to FIG. 3, source region 34 is coupled to signal node 92 and drain region 36 is coupled to ground node 94.

Thus, it is apparent that there has been described in accordance with the invention, a lateral high-voltage junction device and an input protection circuit that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a wide variety of materials and processes can be used to fabricate the lateral high-voltage junction devices described above. It is therefore intended to include within the invention all such variations and modifications that fall within the scope of the appended claims and equivalents thereof.

The invention claimed is:

1. An input protection circuit comprising:
   a voltage supply node and a ground node;
   an MOS circuit coupled to the voltage supply node and to the ground node;
   a transistor coupled to the voltage supply node and to the ground node in parallel with the MOS circuit and having a first junction region coupled to the voltage supply node, a second junction region coupled to the ground node, a junction-free substrate region between the first and second junction regions, an MOS gate electrode overlying the substrate region and separated therefrom by a gate oxide layer, and dielectric sidewall spacers adjacent to opposing sides of the MOS gate electrode and overlying the junction-free substrate region;
   a compensating diode coupled to the voltage supply node and to the ground node in parallel with the MOS circuit and the transistor; and
   wherein the second junction region and the substrate region comprise a semiconductor material of the same conductivity type.

2. The input protection circuit of claim 1 wherein the transistor comprises a plurality of 1 to N forward biased diodes connected in series, such that the first junction region of the first diode is coupled to the voltage supply node and the second junction region of the Nth diode is coupled to the ground node.

3. A circuit comprising:
   an MOS circuit coupled to a voltage supply node and a ground node;
   a lateral high-voltage junction device for over voltage protection of the MOS circuit, the device coupled to the voltage supply and ground node in parallel with the MOS circuit, the device comprising:
      a substrate having a first junction region separated from a second junction region by a uniformly doped substrate region extending from the first junction region to the second junction region;
      an MOS gate electrode overlying the uniformly doped substrate region and separated therefrom by a gate oxide layer; and
      dielectric sidewall spacers adjacent to opposing sides of the MOS gate electrode and overlying the uniformly doped substrate region; and
   a compensating diode coupled to the voltage supply and ground node in parallel with the MOS circuit and the lateral high-voltage junction device.

4. The circuit of claim 3, wherein the first junction region and the substrate region comprise semiconductor materials of different conductivity types, the first junction being coupled to the voltage supply node, and the second junction and the substrate region comprise a semiconductor material of the same conductivity types, the second junction being coupled to the ground node.

5. The circuit of claim 3, wherein the first junction region comprises an anode and the second junction region comprises a cathode, and wherein the anode and the cathode have an opposite conductivity type.

* * * * *